(12) United States Patent
Shi et al.

(10) Patent No.: US 11,322,699 B2
(45) Date of Patent: May 3, 2022

(54) DISPLAY PANEL AND MANUFACTURING METHOD THEREOF

(71) Applicant: WUHAN CHINA STAR OPTOELECTRONICS TECHNOLOGY CO., LTD., Hubei (CN)

(72) Inventors: Jie Shi, Hubei (CN); Simin Peng, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 183 days.

(21) Appl. No.: 16/652,205

(22) PCT Filed: Nov. 11, 2019

(86) PCT No.: PCT/CN2019/117106
§ 371 (c)(1),
(2) Date: Mar. 30, 2020

(87) PCT Pub. No.: WO2021/077475
PCT Pub. Date: Apr. 29, 2021

(65) Prior Publication Data
US 2021/0408407 A1 Dec. 30, 2021

(30) Foreign Application Priority Data
Oct. 25, 2019 (CN) .......................... 201911025773.4

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3244* (2013.01); *H01L 51/5253* (2013.01);
(Continued)

(58) Field of Classification Search
None
See application file for complete search history.

(56) References Cited

U.S. PATENT DOCUMENTS 10,930,867 B2* 2/2021 Kim .................. H01L 51/5253
2016/0079332 A1* 3/2016 Lee .................... H01L 51/5275
257/40
(Continued)

FOREIGN PATENT DOCUMENTS

| CN | 109920822 A | 6/2019 |
| CN | 110491912 A | 11/2019 |
| JP | 2011054424 A | 3/2011 |

*Primary Examiner* — J. E. Schoenholtz

(57) ABSTRACT

A display panel and a manufacturing method thereof of the present disclosure provide a substrate including a non-display area, a display area disposed around the non-display area, a light-converging structure disposed on the substrate of the non-display area, and a functional layer disposed on the substrate and provided with a through-hole corresponding to the non-display area, wherein the through-hole penetrates the functional layer, thereby reducing the loss of light transmitted to the camera, greatly increasing an amount of light that enters the camera, and improving the image quality of the camera.

9 Claims, 4 Drawing Sheets

(51) Int. Cl.
*H01L 51/52* (2006.01)
*H01L 51/56* (2006.01)

(52) U.S. Cl.
CPC ........ *H01L 51/56* (2013.01); *H01L 2227/323* (2013.01); *H01L 2251/105* (2013.01)

(56) References Cited

U.S. PATENT DOCUMENTS

| | | | |
|---|---|---|---|
| 2017/0026553 A1* | 1/2017 | Lee | G02F 1/133351 |
| 2020/0194714 A1* | 6/2020 | Won | H01L 51/5246 |
| 2020/0313102 A1* | 10/2020 | Kim | H01L 27/3258 |
| 2021/0011519 A1* | 1/2021 | Woo | G06F 1/1618 |

\* cited by examiner

DISPLAY PANEL AND MANUFACTURING METHOD THEREOF

FIELD AND BACKGROUND OF THE INVENTION

The present disclosure relates to the field of display technologies, and more particularly, to a display panel and a manufacturing method thereof.

Currently, as emerging organic light-emitting diode display devices, under-screen camera display devices have been developed rapidly. A camera is disposed below the display screen, display components above the camera remain, and pixel areas of a substrate emit light normally.

In recent years, the rapid development of under-screen camera display devices has exposed many problems. Due to film layer barriers above the camera and different refractive index of film layers, light irradiated from outside causes refraction and reflection phenomenon of an area between the film layers, thereby losing a large amount of light, greatly reducing the amount of light that enters the camera in the end, which affects image quality.

Therefore, how to increase the amount of light that enters the camera on the premise of ensuring the image quality is a difficulty that panel manufacturers around the world are trying to overcome.

SUMMARY OF THE INVENTION

The present disclosure provides a display device and manufacturing method thereof, to solve the technical problem that the existing display device losing a large amount of light in the propagation path during light transmitted to the camera, which affects the imaging quality.

The present disclosure provides a display device, including:

a substrate including a non-display area, a display area disposed around the non-display area, and a light-converging structure disposed on the substrate of the non-display area; and a functional layer disposed on the substrate, the functional layer is provided with a through-hole corresponding to the non-display area, wherein the through-hole penetrates the functional layer.

In one display device of the present disclosure, the light-converging structure is a convex lens structure.

In one display device of the present disclosure, a height of a protrusion of the convex lens structure is less than a radius of the through-hole.

In one display device of the present disclosure, part of the substrate of the non-display area includes a first main portion, a first protrusion disposed on a side of the first main portion, and a second protrusion disposed on another side of the first main portion.

In one display device of the present disclosure, a thickness of the first main portion is less than or equal to a thickness of part of the substrate of the display area.

In one display device of the present disclosure, part of the substrate of the non-display area includes a second main portion and a third convex disposed on a side of the second main portion away from the functional layer; and a surface of the second main portion facing the functional layer is flush with a surface of part of the substrate of the display area facing the functional layer.

In one display device of the present disclosure, a thickness of the second main portion is less than or equal to a thickness of part of the substrate of the display area.

In one display device of the present disclosure, the functional layer includes an array layer, a light emitting layer, and an encapsulation layer sequentially disposed on the substrate, and the through-hole penetrates the array layer, the light emitting layer, and the encapsulation layer.

In one display device of the present disclosure, a material of the substrate includes polyimide.

The present disclosure further provides a display device, including a substrate, wherein a material of the substrate includes polyimide, the substrate including a non-display area, a display area disposed around the non-display area, and alight-converging structure disposed on the substrate of the non-display area, the light-converging structure is a convex lens structure; and a functional layer disposed on the substrate, wherein the functional layer is provided with a through-hole corresponding to the non-display area, and the through-hole penetrates the functional layer.

In one display device of the present disclosure, a height of a protrusion of the convex lens structure is less than a radius of the through-hole.

In one display device of the present disclosure, part of the substrate of the non-display area includes a first main portion, a first protrusion disposed on a side of the first main portion, and a second protrusion disposed on another side of the first main portion.

In one display device of the present disclosure, a thickness of the first main portion is less than or equal to a thickness of part of the substrate of the display area.

In one display device of the present disclosure, part of the substrate of the non-display area includes a second main portion and a third convex disposed on a side of the second main portion away from the functional layer; and a surface of the second main portion facing the functional layer is flush with a surface of part of the substrate of the display area facing the functional layer.

In one display device of the present disclosure, a thickness of the second main portion is less than or equal to a thickness of part of the substrate of the display area.

In one display device of the present disclosure, the functional layer includes an array layer, a light emitting layer, and an encapsulation layer sequentially disposed on the substrate, and the through-hole penetrates the array layer, the light emitting layer, and the encapsulation layer.

The present disclosure further provides a method of manufacturing a display device, including providing a substrate including a non-display area and a display area disposed around the non-display area;

forming a light-converging structure on part of the substrate of the non-display area by a nano-imprint process;

forming a functional layer on the substrate, the functional layer including an array layer, a light emitting layer, and an encapsulation layer sequentially disposed on the substrate; and forming a through-hole on the functional layer corresponding to the non-display area, wherein the through-hole penetrates the functional layer.

In a display panel and a manufacturing method thereof of the present disclosure, by providing through-holes that penetrates a functional layer, this reduces thickness of the film layer disposed on the camera, thereby ensuring that vertically incident light can be transmitted to the camera almost without loss. By disposing the substrate of a non-display area into a light-converging structure, light is converged when it is emitted from the substrate, causing easy absorption of the light by the camera, thereby reducing the loss of light during transmission to the camera, greatly increasing the amount of light that enters the camera, and improving image quality.

BRIEF DESCRIPTION OF FIGURES

In order to more clearly illustrate the embodiments or the technical solutions in the prior art or the embodiment, the figures used in the description of the embodiments or the prior art will be briefly introduced below. Obviously, the figures in the following description are merely some embodiments of the present disclosure, for those of ordinary skill in the art, other figures may be obtained based on these figures without inventive steps.

DESCRIPTION OF SPECIFIC EMBODIMENTS OF THE INVENTION

In the following, the technical solutions in the embodiments of the present disclosure will be clearly and completely described with reference to the figures. Obviously, the described embodiments are only some the embodiments of the present disclosure, not all the embodiments. Based on the embodiments in the present disclosure, all other embodiments obtained by a person of ordinary skill in the art without creative steps shall fall within the protection scope of the present disclosure.

Figure 1:
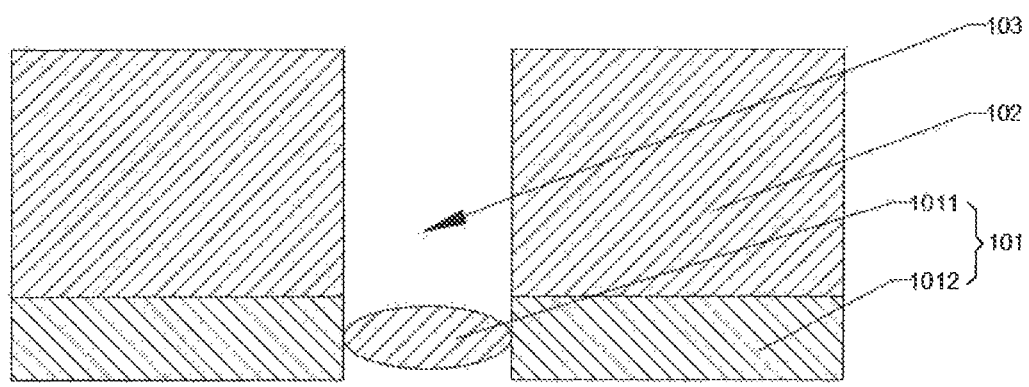
FIG. 1 shows a schematic diagram of first display device structure according to one embodiment of the present disclosure.

Please refer to FIG. 1. FIG. 1 shows a schematic diagram of first display device structure according to one embodiment of the present disclosure. As shown in FIG. 1, the present disclosure provides a display device, including a substrate 101, a functional layer 102 disposed on the substrate 101, a through-hole 103 disposed on the functional layer 102, a display area 1012 disposed around the non-display area 1011, and a light-converging structure disposed on the non-display area 1012, wherein the through-hole 103 is disposed corresponding to the non-display area 1011, and the through-hole 103 penetrates the functional layer 102.

It can be understood that by providing a through-hole that penetrates the functional layer 102 corresponding to the non-display area 1011, a thickness of the film layer disposed on the camera can be reduced, thereby ensuring that vertically incident light can be transmitted to the camera almost without loss. In the process of light transmitted from the substrate 101 to the air and absorbed by the camera of the prior art, refraction phenomenon of light occurs, and the light exits along a direction away from a normal line, resulting in some light leaking from the gap between the camera and the substrate 101 and being unable to be absorbed by the camera. In one embodiment of the present disclosure, a light-converging structure is disposed on a part of the substrate 101 of the non-display area 1012 so that the light emitted from the substrate 101 will exit along a direction close to the normal line, concentrating the light and causing the light more easily to be absorbed by the camera, thereby reducing the loss of light during transmission to the camera, greatly increasing the amount of light that enters the camera, and improving image quality.

In one embodiment, the light-converging structure is a convex lens structure. Convex lenses are made according to the principle of refraction of light and have a certain concentrating effect. A convex lens is a lens with a thicker center and a thinner edge and is mainly classified into three types: a biconvex, a piano-convex, and a concave-convex lenses. The convex lenses include an incident surface and an exit surface, and both the incident surface and the exit surface of the biconvex lens are convex surfaces. The piano-convex lens is that one of the incident surface and the exit surface is a convex surface, and other one is a plan surface. The concave-convex lens is that one of the incident surface and the exit surface is a concave surface and the other one is a convex surface, wherein a shape of the concave-convex lens is similar to a crescent.

It can be understood that disposing the light-converging structure as a convex lens structure is to concentrate the light so that the camera can receive more light. Whether the convex lens structure is a biconvex, a plano-convex, or a concave-convex lenses, all of them can achieve the effect of concentrating the light. However, it is necessary to satisfy that a protruding height of the convex lens structure is less than a radius of the through-hole 103, so a focal length of the convex lens structure can be greater than a radius of the through-hole 103 so that the convex lens structure can achieve the effect of concentrating the light, and the camera can receive more light, thereby improving image quality.

In one embodiment, the material of the substrate 101 includes a polyimide, and the polyimide is an organic polymer material with best overall performance, which is widely used in the field of flexible substrates because of its excellent mechanical properties, dielectric properties, high-temperature resistance, low-temperature resistance, and radiation resistance.

Figure 2:
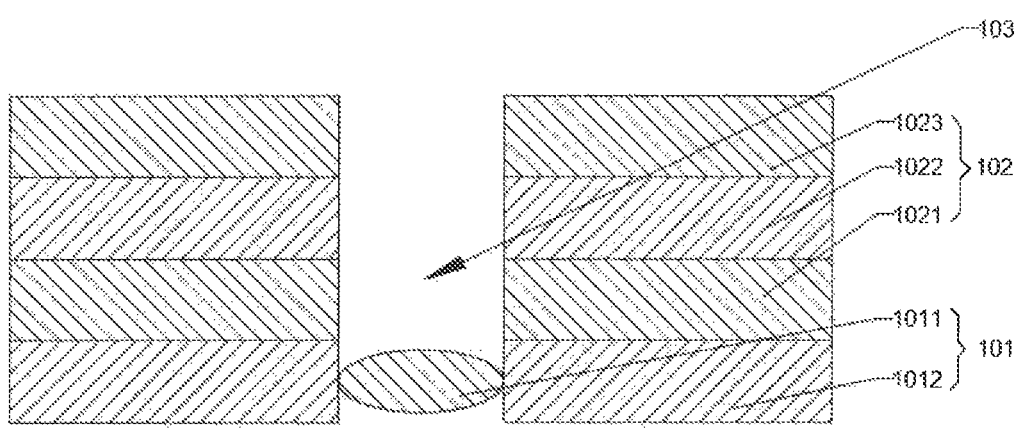
FIG. 2 shows a schematic diagram of second display device structure according to one embodiment of the present disclosure.

Specifically, please refer to FIG. 1 and FIG. 2. FIG. 2 shows a schematic diagram of the second display device structure according to one embodiment of the present disclosure. The difference between the display device as shown in FIG. 2 and the display device as shown in FIG. 1 is that the functional layer 102 in the display device shown in FIG. 2 includes an array layer 1021, a light-emitting layer 1022, and an encapsulation layer 1023, which are sequentially disposed on the substrate 101, and the through-hole 103 penetrates the array layer 1021, the light-emitting layer 1022, and the encapsulation layer 1023.

Figure 3:
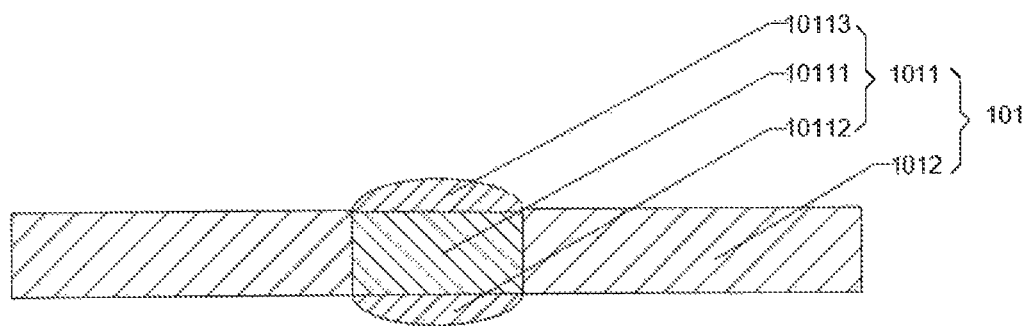
FIG. 3 shows a schematic diagram of a first substrate structure according to one embodiment of the present disclosure.
Figure 4:
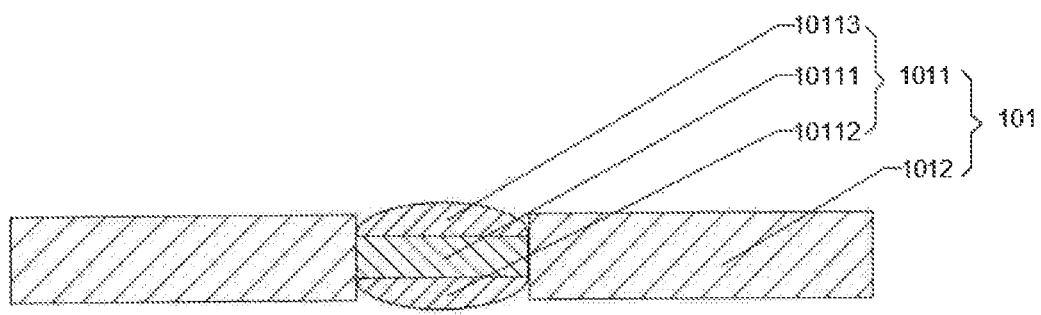
FIG. 4 shows a schematic diagram of a second substrate structure according to one embodiment of the present disclosure.
Figure 5:
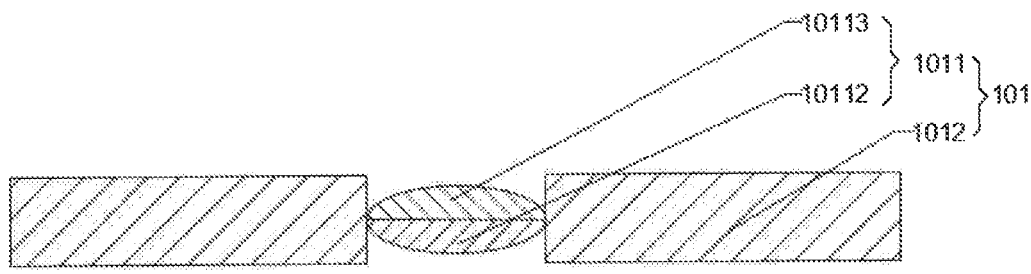
FIG. 5 shows a schematic diagram of a third substrate structure according to one embodiment of the present disclosure.

Specifically, please refer to FIG. 3, FIG. 4, and FIG. 5. FIG. 3 shows a schematic diagram of a first substrate structure according to one embodiment of the present disclosure, FIG. 4 shows a schematic diagram of a second substrate structure according to one embodiment of the present disclosure, and FIG. 5 shows a schematic diagram of a third substrate structure according to one embodiment of the present disclosure. In the schematic diagrams of the substrate structure as shown in FIG. 3, FIG. 4 and FIG. 5, it can be seen that the substrate 101 disposed on the non-display area 1011 is divided into three parts: specifically, the first main portion 10111, a first protrusion 10112 disposed on a side of the first main portion 10111, and a second protrusion 10113 disposed on another side of the first main portion 10111. The difference is that a thickness of the first main portion 10111 is not same.

It can be understood that a thickness of the first main portion 10111 is less than or equal to a thickness of part of the substrate 101 of the display area 1012. As shown in FIG. 3, a thickness of the first main portion 10111 is equal to a thickness of the substrate 101 of the display area 1012. As shown in FIG. 4, a thickness of the first main portion 10111 is less than a thickness of part of the substrate 101 of the display area 1012. As shown in FIG. 5, a thickness of the first main portion 10111 is zero, that is, the substrate 101 only includes the first protrusion 10112 and the second protrusion 10113, that is, regardless of the change in the thickness of the first main portion 10111, as long as the focal length of the convex lens structure is greater than a distance from the convex lens structure to the camera, the camera can receive sufficient light, thereby improving the image quality of the camera. Because if the focal length of the convex lens structure is less than the distance from the convex lens structure to the camera, all the light would be focused on the focal point of the convex lens structure, some components of the camera will not receive light and it is not beneficial for improving image quality of the camera.

It can be understood that the convex lens structure is a biconvex lens structure.

Figure 6:
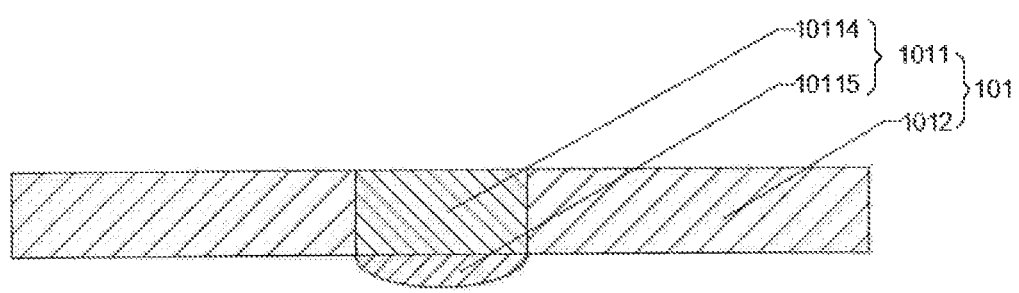
FIG. 6 shows a schematic diagram of a fourth substrate structure according to one embodiment of the present disclosure.
Figure 7:
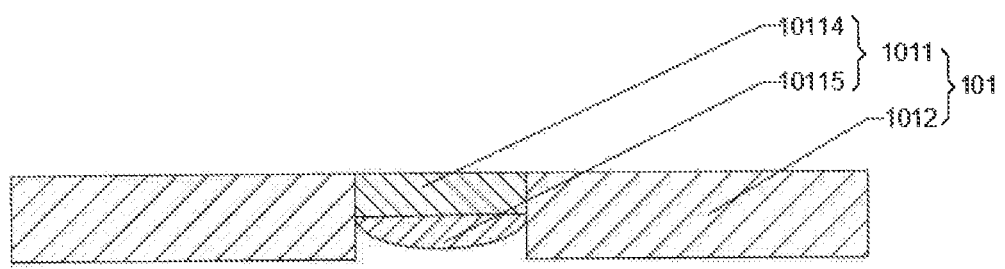
FIG. 7 shows a schematic diagram of a fifth substrate structure according to one embodiment of the present disclosure.
Figure 8:
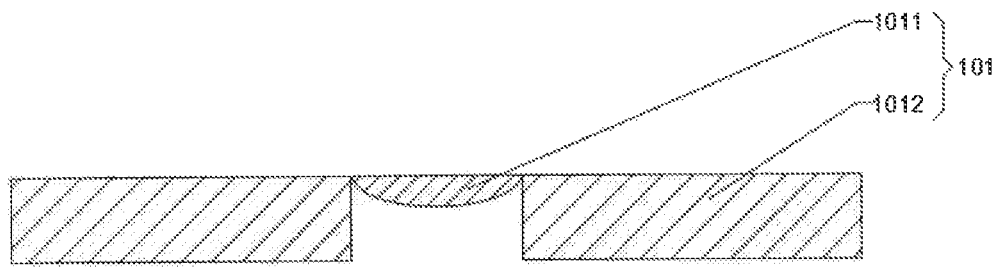
FIG. 8 shows a schematic diagram of a sixth substrate structure according to one embodiment of the present disclosure.

Specifically, please refer to FIG. 6, FIG. 7, and FIG. 8. FIG. 6 shows a schematic diagram of a fourth substrate structure according to one embodiment of the present disclosure, FIG. 7 shows a schematic diagram of a fifth substrate structure according to one embodiment of the present disclosure, and FIG. 8 shows a schematic diagram of a sixth substrate structure according to one embodiment of the present disclosure. In the schematic diagrams of the substrate structures as shown in FIG. 6, FIG. 7, and FIG. 8, it can be seen that part of the substrate 101 of the non-display area 1011 is divided into a second main portion 10114 and a third protrusion 10115 disposed on a side of the second main portion 10114 away from the functional layer 102, and a surface of the second main portion 10114 facing the functional layer 102 is flush with a surface of part of the substrate 101 of the display area 1012 facing the functional layer 102. The difference is that the thickness of the second main portion 10114 is not same.

It can be understood that a thickness of the second main portion 10114 is less than or equal to a thickness of part of the substrate 101 of the display area 1012. As shown in FIG. 6, the thickness of the second main portion 10114 is equal to the thickness of part of the substrate 101 of the display area 1012. As shown in FIG. 7, a thickness of the second main portion 10114 is less than a thickness of the substrate 101 of the display area 1012. As shown in FIG. 8, a thickness of the second main portion 10114 is zero at this time, that is, the substrate 101 only includes the third protrusion 10115. Regardless of how the thickness of the second main portion 10114 changes, as long as the focal length of the convex lens structure is greater than the distance from the convex lens structure to the camera, the camera can receive enough light to improve the camera image quality. Because if the focal length of the convex lens structure is less than the distance from the convex lens structure to the camera, all the light would be focused on the focal point of the convex lens structure, some components of the camera will not receive light and it is not beneficial for improving image quality of the camera.

It can be understood that, the convex lens structure is a plano-convex lens structure, and a convex shape is disposed on a side of the convex lens structure away from the functional layer 102.

In one embodiment, the convex lens structure is a plano-convex lens structure, and a convex shape is disposed on a side of the convex lens structure near the functional layer 102, the piano-convex lens structure can also concentrate light so that the camera receives more light, thereby improving camera image quality.

In one embodiment, the convex lens structure is a concave-convex lens structure, and a convex shape is disposed on a side of the convex lens structure away from the functional layer 102. The concave-convex lens structure can also concentrate light so that the camera receives more light, thereby improving camera imaging quality.

In one display device of the present disclosure, by providing a through-hole 103 that penetrates a functional layer 102 to reduce a thickness of the film layer disposed on the camera, it is ensured that vertically incident light can be transmitted to the camera almost without loss. By disposing the substrate 101 of a non-display area 1011 into a light-converging structure, light is concentrated when it is emitted from the substrate 101, causing an easy absorption of the light by the camera, thereby reducing the loss of light during transmission to the camera, greatly increasing the amount of light that enters the camera, and improving image quality.

Figure 9:
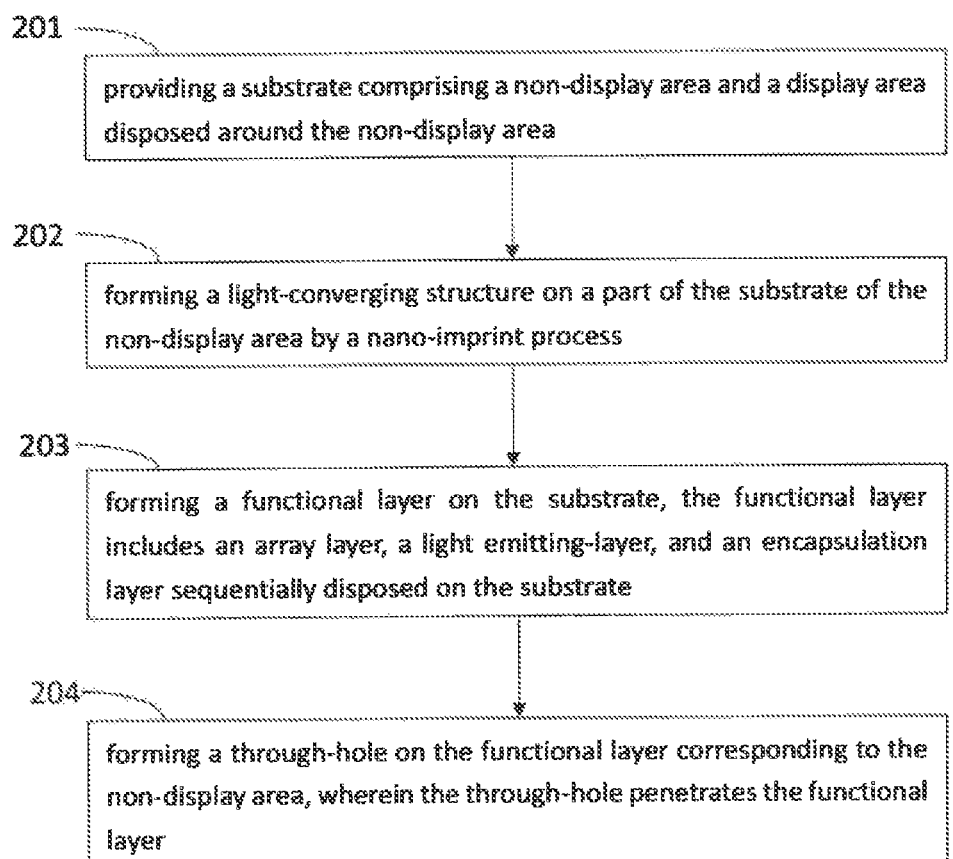
FIG. 9 is a flowchart of a method of manufacturing a display device according to one embodiment of the present disclosure.

Referring to FIG. 9, FIG. 9 is a flowchart of a method of manufacturing a display device according to one embodiment of the present disclosure. As shown in FIG. 9, the method includes the following steps: 201, providing a substrate comprising a non-display area and a display area disposed around the non-display area; 202, forming a light-converging structure on a part of the substrate of the non-display area by a nano-imprint process; 203, forming a functional layer on the substrate, the functional layer includes an array layer, a light emitting-layer, and an encapsulation layer sequentially disposed on the substrate; and 204, forming a through-hole on the functional layer corresponding to the non-display area, wherein the through-hole penetrates the functional layer.

It can be understood that nano-imprint technology is a new type of micro-nano processing technology, which is a technology that transfers the micro-nano structure on the template to the material to be processed with the aid of photoresist. The substrate structures as shown in FIGS. 3, 4 and, 5 are all formed by a double-sided embossing method, and using a same nano-imprinting mold, except that the depth of embossing is different to form different substrate structures. The substrate structures as shown in FIG. 6, FIG. 7, and FIG. 8 are all formed by a single-sided imprinting method, and using a same nano-imprinting mold, except that the depth of embossing is different to form different substrate structures.

It can be understood that during the process of disposing a part of the substrate of the non-display area into a convex lens structure through nano-imprinting, the imprinting depth cannot be too deep, because when the imprinting depth is too deep, if imprinting depth reach the photopolymerization, then all the light will be concentrated to a point after being emitted from the substrate. This results in that the camera can only receive light at this point, and other part of the camera will not receive light, which affects the image quality of the camera.

It can be understood that the through-hole is formed by a laser lift-off method. Specifically, after the encapsulating is completed, the functional layer corresponding to the non-display area is hollowed out by laser directly to form the through-hole penetrating the functional layer.

The specific structure of the display device provided in the present disclosure can be referred to the foregoing embodiments, and details are not described herein again.

It can be understood that a display panel and a manufacturing method thereof of the present disclosure provide a through-hole that penetrates a functional layer to reduce a thickness of the film layer disposed on the camera, thereby ensuring that vertically incident light can be transmitted to the camera almost without loss. By disposing the substrate of a non-display area into a light-converging structure, light is concentrated when it is emitted from the substrate, causing easy absorption of the light by the camera, thereby reducing the loss of light during transmission to the camera, greatly increasing the amount of light that enters the camera, and improving image quality.

The foregoing provides a detailed description of the embodiments of the present disclosure. Specific embodiments are used herein to explain the principles and embodiments of the present disclosure. The descriptions of the above embodiments are only used to help understand the present disclosure. For those skilled in the art, according to the idea of the present disclosure, there will be changes in the specific implementation and the scope of application. In summary, the content of this description should not be considered as a limitation to the present disclosure.

The above description only the preferred embodiments of the present disclosure. It should be noted that for those of ordinary skill in the art without departing from the principles of the present disclosure, several improvements and adjustments can be made, and these improvements and adjustments should also be considered in the protection scope of the present disclosure.

What is claimed is:

1. A display device, comprising:
    a substrate comprising a non-display area, a display area disposed around the non-display area, and a light-converging structure disposed on a part of the substrate of the non-display area; and
    a functional layer disposed on the substrate and provided with a through-hole corresponding to the non-display area, wherein the through-hole penetrates the functional layer;
    wherein the light-converging structure is a convex lens structure; and
    wherein the part of the substrate of the non-display area comprises a first main portion, a first protrusion disposed on a side of the first main portion, and a second protrusion disposed on another side of the first main portion.

2. The display device as claimed in claim 1, wherein a height of a protrusion of the convex lens structure is less than a radius of the through-hole.

3. The display device as claimed in claim 1, wherein a thickness of the first main portion is less than or equal to a thickness of a part of the substrate of the display area.

4. The display device as claimed in claim 1, wherein the functional layer comprises an array layer, a light-emitting layer, and an encapsulation layer sequentially disposed on the substrate, and the through-hole penetrates the array layer, the light-emitting layer, and the encapsulation layer.

5. The display device as claimed in claim 1, wherein a material of the substrate comprises polyimide.

6. A method of manufacturing a display device, comprising:
    providing a substrate comprising a non-display area and a display area disposed around the non-display area;
    forming a light-converging structure on a part of the substrate of the non-display area by a nano-imprint process;
    forming a functional layer on the substrate, wherein the functional layer comprises an array layer, a light emitting-layer, and an encapsulation layer sequentially disposed on the substrate; and
    forming a through-hole on the functional layer corresponding to the non-display area, wherein the through-hole penetrates the functional layer.

7. A display device, comprising:
    a substrate comprising a non-display area, a display area disposed around the non-display area, and a light-converging structure disposed on a part of the substrate of the non-display area; and
    a functional layer disposed on the substrate and provided with a through-hole corresponding to the non-display area, wherein the through-hole penetrates the functional layer;
    wherein the light-converging structure is a convex lens structure; and
    wherein the part of the substrate of the non-display area comprises a second main portion and a third protrusion disposed on a side of the second main portion away from the functional layer; and
    a surface of the second main portion facing the functional layer is flush with a surface of the part of the substrate of the display area facing the functional layer.

8. The display device as claimed in claim 7, wherein a thickness of the second main portion is less than or equal to a thickness of the part of the substrate of the display area.

9. The display device as claimed in claim 7, wherein a height of a protrusion of the convex lens structure is less than a radius of the through-hole.

* * * * *